United States Patent
Chyan

(10) Patent No.: US 8,392,766 B2
(45) Date of Patent: Mar. 5, 2013

(54) OPERATIONAL METHOD OF A CONTROLLER OF A FLASH MEMORY, AND ASSOCIATED MEMORY DEVICE AND CONTROLLER THEREOF

(75) Inventor: Yu-Wei Chyan, Hsinchu (TW)

(73) Assignees: Silicon Motion Inc., keji Chuangyeyuan, Tianan Digital, Futian, Shenzhen, Guangdong (CN); Silicon Motion Inc., Jhubei, Hsinchu County (TW)

( * ) Notice: Subject to any disclaimer, the term of this patent is extended or adjusted under 35 U.S.C. 154(b) by 457 days.

(21) Appl. No.: 12/619,615

(22) Filed: Nov. 16, 2009

(65) Prior Publication Data

US 2011/0004795 A1  Jan. 6, 2011

(30) Foreign Application Priority Data

Jul. 2, 2009  (TW) ................................ 98122406 A

(51) Int. Cl.
*G06F 11/00* (2006.01)
*G11C 29/00* (2006.01)
(52) U.S. Cl. ........ 714/703; 714/702; 714/704; 714/718; 714/742; 714/746
(58) Field of Classification Search .................. 714/718, 714/704, 703, 702, 723, 742, 746
See application file for complete search history.

(56) References Cited

U.S. PATENT DOCUMENTS

| | | | |
|---|---|---|---|
| 6,182,248 B1 * | 1/2001 | Armstrong et al. .............. 714/43 |
| 7,020,803 B2 * | 3/2006 | Wolin et al. ...................... 714/41 |
| 7,031,902 B1 * | 4/2006 | Catiller ........................... 703/24 |
| 7,401,269 B2 * | 7/2008 | Hoda et al. ..................... 714/703 |
| 7,536,605 B2 * | 5/2009 | Keaffaber et al. ............... 714/41 |
| 7,827,445 B2 * | 11/2010 | Foster et al. ..................... 714/41 |
| 7,962,777 B2 * | 6/2011 | Gonzalez et al. .............. 714/5.1 |
| 2004/0187051 A1 * | 9/2004 | Berry et al. .................... 714/718 |
| 2009/0249148 A1 * | 10/2009 | Ito et al. ........................ 714/746 |
| 2010/0107006 A1 * | 4/2010 | Fey et al. ........................ 714/15 |

FOREIGN PATENT DOCUMENTS

| | | |
|---|---|---|
| CN | 1287309 A | 3/2001 |
| CN | 2874629 Y | 2/2007 |
| CN | 101211285 A | 7/2008 |

OTHER PUBLICATIONS

IBM, NN9009345, Error Injection Method for Testing Error Recovery Procedures, Sep. 9, 1990, IBM, vol. 33, Issue 3, pp. 345-346.*
Hsueh, Mei-Chen et al., Fault Injection Techniques and Tools, Apr. 1997. IEEE, pp. 75-82.*

* cited by examiner

*Primary Examiner* — John J Tabone, Jr.
(74) *Attorney, Agent, or Firm* — Winston Hsu; Scott Margo

(57) ABSTRACT

A method for enhancing verification efficiency regarding error handling mechanism of a controller of a Flash memory includes: providing an error generation module, for generating errors; and triggering the error generation module to actively generate errors of at least one specific type in order to increase an error rate corresponding to the specific type. An associated memory device and the controller thereof are provided, where the controller includes: a ROM arranged to store a program code; a microprocessor arranged to execute the program code to control access to the Flash memory and manage a plurality of blocks, and further enhance the verification efficiency regarding error handling mechanism of the controller; and an error generation module arranged to generate errors. The controller that executes the program code by utilizing the microprocessor triggers the error generation module to actively generate errors of at least one specific type to increase an error rate.

30 Claims, 4 Drawing Sheets

OPERATIONAL METHOD OF A CONTROLLER OF A FLASH MEMORY, AND ASSOCIATED MEMORY DEVICE AND CONTROLLER THEREOF

BACKGROUND OF THE INVENTION

1. Field of the Invention

The present invention relates to access to a Flash memory, and more particularly, to a method for enhancing verification efficiency regarding an error handling mechanism of a controller of a Flash memory, and to an associated memory device and a controller thereof.

2. Description of the Prior Art

As technologies of Flash memories progress in recent years, many kinds of portable memory devices, such as memory cards respectively complying with SD/MMC, CF, MS, and XD standards, are widely implemented in various applications. Therefore, the control of access to Flash memories in these portable memory devices has become an important issue.

Taking NAND Flash memories as an example, they can mainly be divided into two types, i.e. Single Level Cell (SLC) Flash memories and Multiple Level Cell (MLC) Flash memories. Each transistor that is considered a memory cell in SLC Flash memories only has two charge levels that respectively represent a logical value 0 and a logical value 1. In addition, the storage capability of each transistor that is considered a memory cell in MLC Flash memories can be fully utilized. More specifically, the voltage for driving memory cells in the MLC Flash memories is typically higher than that in the SLC Flash memories, and different voltage levels can be applied to the memory cells in the MLC Flash memories in order to record information of two bits (e.g. binary values 00, 01, 11, or 10) or more in a transistor that is considered a memory cell. Theoretically, the storage density of the MLC Flash memories may reach twice the storage density of the SLC Flash memories, which is considered good news for NAND Flash memory manufacturers who encountered a bottleneck of NAND Flash technologies.

As MLC Flash memories are cheaper than SLC Flash memories, and are capable of providing higher capacity than SLC Flash memories while the space is limited, MLC Flash memories have been a main stream for implementation of most portable memory devices on the market. However, various problems of the MLC Flash memories have arisen due to their unstable characteristics. In order to ensure that the access control of a portable memory device over the Flash memory therein can comply with related standards, the controller of the Flash memory should have an error handling mechanism such as a software error handling mechanism in order to properly handle various errors that occur in different situations.

According to the related art, when verification of the error handling mechanism mentioned above is required, a burn-in test for verifying the error handling mechanism typically becomes a must. For example, a host device can be utilized for constantly accessing the portable memory device in order to perform the burn-in test. However, many types of errors occur randomly. In addition, as the error rates of these errors are typically not high, it usually takes a long time (e.g. up to several hundreds of hours) to perform the burn-in test, wasting time and labor costs. Therefore, a novel method is required for enhancing verification efficiency regarding the error handling mechanism mentioned above.

SUMMARY OF THE INVENTION

It is therefore an objective of the claimed invention to provide a method for enhancing verification efficiency regarding an error handling mechanism of a controller of a Flash memory, and to provide an associated memory device and a controller thereof, in order to solve the above-mentioned problems.

According to a preferred embodiment of the claimed invention, a method for enhancing verification efficiency regarding an error handling mechanism of a controller of a Flash memory comprises: providing an error generation module, for generating errors; and triggering the error generation module to actively generate errors of at least one specific type in order to increase an error rate corresponding to the specific type.

While the method mentioned above is disclosed, an associated memory device is further provided. The memory device comprises: a Flash memory comprising a plurality of blocks; and a controller arranged to access the Flash memory and manage the plurality of blocks, and further enhance verification efficiency regarding an error handling mechanism of the controller. In addition, the controller comprises: an error generation module, for generating errors. Additionally, the controller triggers the error generation module to actively generate errors of at least one specific type in order to increase an error rate corresponding to the specific type.

While the method mentioned above is disclosed, a controller of a memory device is further provided, wherein the controller is utilized for accessing a Flash memory comprising a plurality of blocks. The controller comprises: a read only memory (ROM) arranged to store a program code; a microprocessor arranged to execute the program code to control the access to the Flash memory and manage the plurality of blocks, and further enhance verification efficiency regarding an error handling mechanism of the controller; and an error generation module, for generating errors. In addition, the controller that executes the program code by utilizing the microprocessor triggers the error generation module to actively generate errors of at least one specific type in order to increase an error rate corresponding to the specific type.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
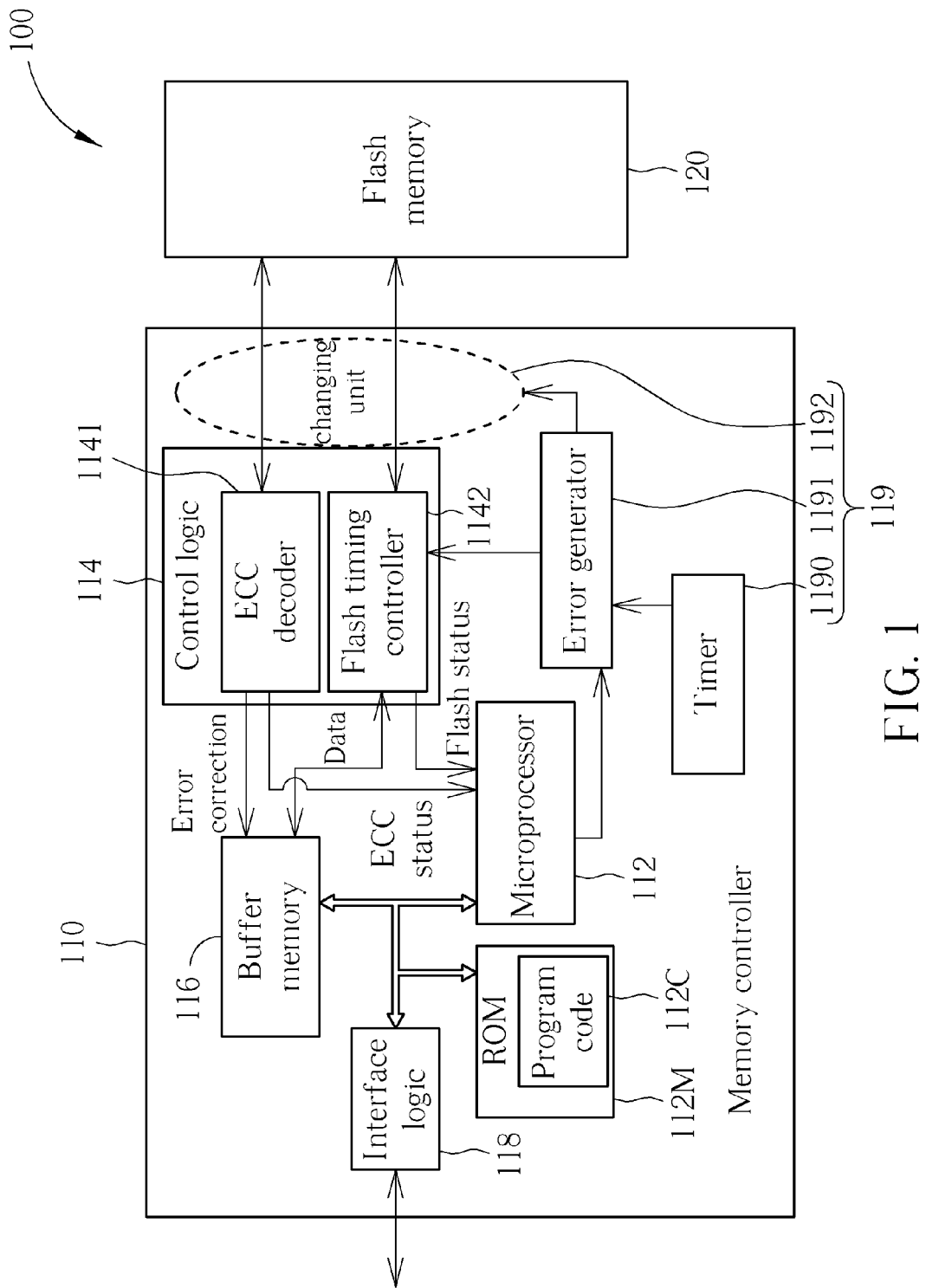
FIG. 1 is a diagram of a memory device according to a first embodiment of the present invention.

Please refer to FIG. 1, which illustrates a diagram of a memory device 100 according to a first embodiment of the present invention. In particular, the memory device 100 of this embodiment is a portable memory device, such as a memory card complying with SD/MMC, CF, MS, or XD standards. The memory device 100 comprises a Flash memory 120, and further comprises a controller arranged to access the Flash memory 120, where the aforementioned controller of this embodiment is a memory controller 110. According to this embodiment, the memory controller 110 comprises a microprocessor 112, a read only memory (ROM) 112M, a control logic 114, a buffer memory 116, an interface logic 118, and an error generation module 119. In addition, the control logic 114 comprises an Error Correction Code (ECC) decoder 1141, and further comprises a timing controller such as a Flash timing controller 1142. Additionally, the error generation module 119 comprises a timer 1190, an error generator 1191, and a changing unit 1192.

In this embodiment, the ROM 112M is arranged to store a program code 112C, and the microprocessor 112 is arranged to execute the program code 112C to control the access to the Flash memory 120. Typically, the Flash memory 120 comprises a plurality of blocks, and the controller (e.g. the memory controller 110 that executes the program code 112C by utilizing the microprocessor 112) performs data erasure operations on the Flash memory 120 by erasing in units of blocks. In addition, a block can be utilized for recording a specific amount of pages, where the controller mentioned above performs data writing operations on the Flash memory 120 by writing/programming in units of pages.

In practice, the memory controller 110 that executes the program code 112C by utilizing the microprocessor 112 is capable of performing various control operations by utilizing the internal components within the memory controller 110. For example, the memory controller 110 utilizes the control logic 114 to control access to the Flash memory 120 (e.g. operations of accessing at least one block or at least one page), utilizes the buffer memory 116 to perform buffering operations for the memory controller 110, and utilizes the interface logic 118 to communicate with a host device.

Figure 2:
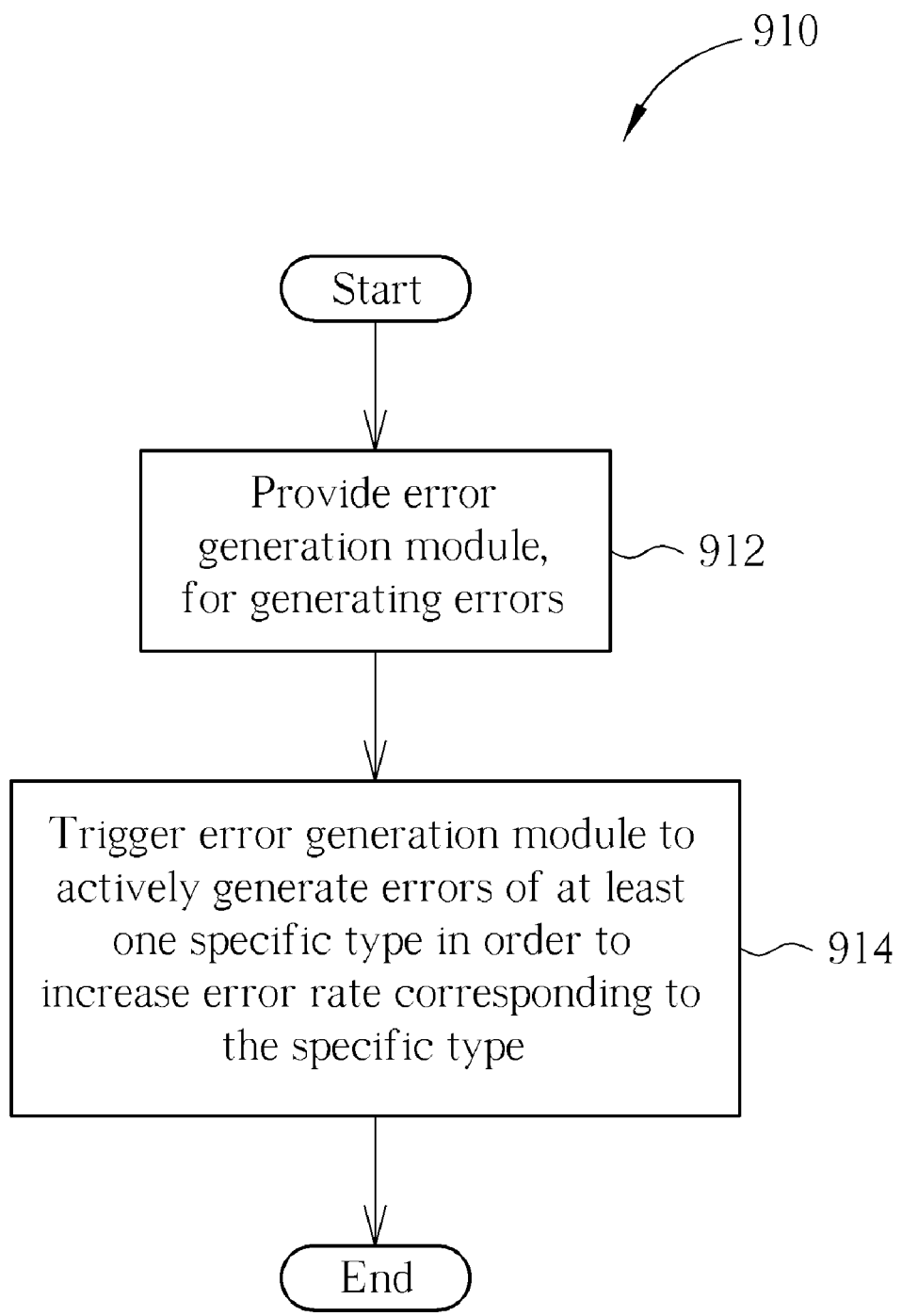
FIG. 2 is a flowchart of a method for enhancing verification efficiency regarding an error handling mechanism of a controller of a Flash memory according to one embodiment of the present invention.

According to this embodiment, in addition to accessing the Flash memory 120, the controller is capable of properly managing the plurality of blocks. In addition, the controller can enhance verification efficiency regarding an error handling mechanism of the controller itself, and more particularly, regarding a software error handling mechanism of the microprocessor 112, where the software error handling mechanism can be implemented in form of software or firmware stored within the memory device 100 (e.g. the software error handling mechanism can be implemented within the program code 112C). In this embodiment, the error generator 1191 is utilized for generating errors, and the controller triggers the error generator 1191 to actively generate errors of at least one specific type in order to increase an error rate corresponding to the specific type. As a result, the controller can verify the error handling mechanism (and more particularly, the software error handling mechanism) regarding the errors of the specific type. Referring to FIG. 2, related details are described as follows.

FIG. 2 is a flowchart of a method 910 for enhancing verification efficiency regarding an error handling mechanism of a controller of a Flash memory according to one embodiment of the present invention. The method can be applied to the memory device 100 shown in FIG. 1, and more particularly, to the controller mentioned above (e.g. the memory controller 110 that executes the program code 112C by utilizing the microprocessor 112). In addition, the method can be implemented by utilizing the memory device 100 shown in FIG. 1, and more particularly, by utilizing the controller mentioned above. The method 910 is described as follows.

In Step 912, provide an error generation module, for generating errors. For example, within the memory controller 110, provide the error generation module 119 in this step, where the error generation module 119 (and more particularly, the error generator 1191 therein) is utilized for generating errors.

In Step 914, the aforementioned controller (e.g. the memory controller 110 that executes the program code 112C by utilizing the microprocessor 112) triggers the error generation module 119 (and more particularly, the error generator 1191 therein) to actively generate errors of at least one specific type in order to increase an error rate corresponding to the specific type. According to this embodiment, in a situation where there is no access error, the memory controller 110 can trigger the error generator 1191, in order to utilize the error generator 1191 to forcibly make any component within the memory controller 110 report any type of errors to the microprocessor 112, and more particularly, to forcibly make at least one component within the memory controller 110 report the errors of the specific type to the microprocessor 112. For example, the controller can utilize a specific component positioned outside the error generation module 119 to randomly trigger the operation being triggered by this step (i.e. Step 914, which is the triggering step of the controller). In another example, the controller can utilize the specific component to trigger the operation being triggered by this step according to a predetermined schedule. This is for illustrative purposes only, and is not meant to be a limitation of the present invention. According to a variation of this embodiment, the error generator 1191 can perform self-triggering operations to actively generate the errors of the specific type. For example, the controller can utilize the error generator 1191 to randomly trigger the operation being triggered by this step. In another example, the controller can utilize the error generator 1191 to trigger the operation being triggered by this step according to a predetermined schedule.

In this embodiment, the error generation module 119 is capable of utilizing the timer 1190 to perform timing control, and further utilizing the error generator 1191 to generate errors relating to time or to adjust time points of generating errors according to the timing control of the timer 1190. In addition, the error generation module 119 is capable of utilizing the error generator 1191 to generate errors, and further utilizing the changing unit 1192 to change signals between the Flash memory 120 and the controller according to the errors generated by the error generator 1191 in order to generate the errors of the specific type. For example, by utilizing the changing unit 1192, the error generator 1191 introduces the errors that are actively generated by the error generator 1191 itself to one or more data transmission paths between the Flash memory 120 and the control logic 114, and more particularly, changes one or more bits of the data transmitted through the data transmission path(s). In practice, the changing unit 1192 can be implemented by utilizing combination(s) of one or more types of logic gates.

According to this embodiment, the controller can utilize the error generator 1191 to change at least one parameter of at least one component within the controller to generate the errors of the specific type. For example, the aforementioned at least one component comprises a timing controller mentioned above. In this situation, the error generator 1191 introduces the errors that are actively generated by the error generator 1191 itself to the Flash timing controller 1142, and more particularly, changes at least one parameter of the Flash timing controller 1142 to generate the errors of the specific type. This is for illustrative purposes only, and is not meant to be a limitation of the present invention. The error generator 1191 can also forcibly make the Flash timing controller 1142 report errors or error information to the microprocessor 112. According to a variation of this embodiment, the aforementioned at least one component comprises the ECC decoder 1141. In this situation, the error generator 1191 introduces the errors that are actively generated by the error generator 1191 itself to the ECC decoder 1141, and more particularly, changes at least one parameter of the ECC decoder 1141 to generate the errors of the specific type.

In addition, the errors of the aforementioned at least one specific type (e.g. one or more specific types) comprise: ECC errors; erasure errors; write/program errors; and/or data transfer errors. In this embodiment, the error generator 1191 can utilize the changing unit 1192 to change one or more bits of data on the data transmission path(s) to generate the ECC errors and/or the data transfer errors. For example, the data original transmitted through a data transmission path is "00000000", and the error generator 1191 utilizes the changing unit 1192 to change the data to be "01010101". Thus, the data written into or read from the Flash memory 120 has four bits of errors. As a result, the controller can increase the error rate(s) of the ECC errors and/or the data transfer errors with proper control. In addition, the error generator 1191 can change at least one parameter of the Flash timing controller 1142 to generate the erasure errors and/or the write/program errors. As a result, the controller can increase the error rate(s) of the erasure errors and/or the write/program errors.

In practice, when the memory controller 110 reads the Flash memory 120, the ECC decoder 1141 performs ECC check on the read data to determine whether the read data is correct data. There are some possible results (statuses) obtained from performing the ECC check, such as a first ECC status in which the read data is correct, a second ECC status in which the read data has correctable errors, and a third ECC status in which the read data has uncorrectable errors. The ECC decoder 1141 reports the results obtained from performing the ECC check to the microprocessor 112, and more particularly, reports the ECC statuses to the microprocessor 112. The error generator 1191 can forcibly make the ECC decoder 1141 report any ECC status (e.g. the second ECC status of correctable errors or the third ECC status of uncorrectable errors) to the microprocessor 112.

When the ECC status reported to the microprocessor 112 indicates that some errors (e.g. correctable errors or uncorrectable errors) occur, the microprocessor 112 performs respective processing regarding different types of errors. For example, when uncorrectable errors occur during reading, the microprocessor 112 replies the host device (not shown in FIG. 1) to notify the host device of the damage of the data to be read.

In addition, when the host device utilizes the memory controller 110 to access the Flash memory 120, the data is temporarily stored in the buffer memory 116, where the Flash timing controller 1142 controls the timing of data transmission. When the memory controller 110 writes a specific amount of data (which is simply referred to as the specific data hereinafter) obtained from the buffer memory 116 into the Flash memory 120, the Flash timing controller 1142 controls and monitors the time spent on writing the specific data. Once the time spent on writing the specific data is too long and exceeds the time limitation defined in some standards (e.g. the SD standards), the Flash timing controller 1142 reports this situation to the microprocessor 112 to notify the microprocessor 112 of the program error that occurs during writing the specific data. As a result, the microprocessor 112 deals with this error. For example, the microprocessor 112 controls the control logic 114 to write the specific data again. The error generator 1191 can control the Flash timing controller 1142 to generate the write/program errors mentioned above, or any possible error, with the Flash timing controller 1142, in order to make the Flash timing controller 1142 report these errors to the microprocessor 112. The error generator 1191 can also forcibly make the Flash timing controller 1142 report any error or error information to the microprocessor 112.

Figure 3:
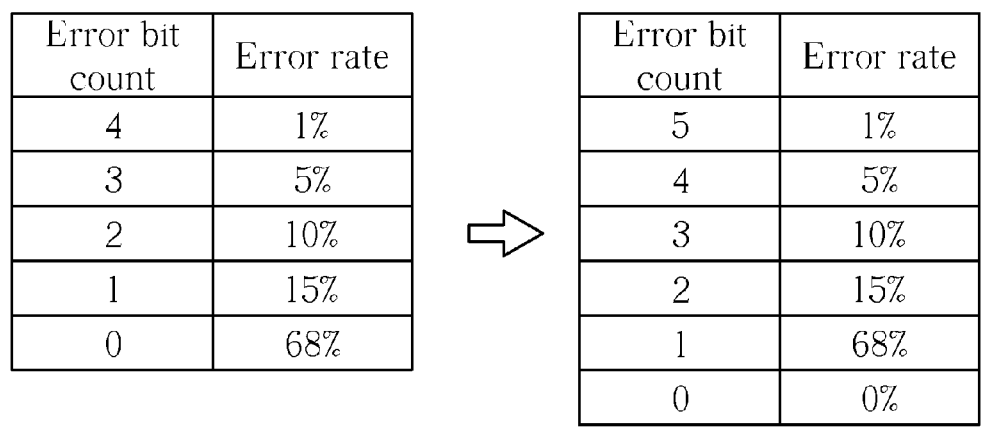
FIG. 3 is a diagram illustrating error rates involved with the method shown in FIG. 2 according to an embodiment of the present invention.

FIG. 3 is a diagram illustrating error rates involved with the method shown in FIG. 2 according to an embodiment of the present invention. As shown in the left half of FIG. 3, before applying the method shown in FIG. 2, the error rates corresponding to the error bit counts 4, 3, 2, 1, and 0 are 1%, 5%, 10%, 15%, and 68%, respectively. As shown in the right half of FIG. 3, in a situation where the actively generated errors cause an additional error bit in this embodiment, the table content of the error rate in each row moves one row upward. As a result, the error rates corresponding to the error bit counts 5, 4, 3, 2, 1, and 0 are 1%, 5%, 10%, 15%, 68%, and 0%, respectively. This is for illustrative purposes only, and is not meant to be a limitation of the present invention. According to a variation of this embodiment, in a situation where the actively generated errors cause additional X error bits, the table content of the error rate in each row moves X rows upward, where X is a positive integer. More particularly, in this variation, X is a positive integer greater than one. As a result, the error rates corresponding to the error bit counts (X+4), (X+3), (X+2), (X+1), and X are respectively 1%, 5%, 10%, 15%, and 68%, where the error rate corresponding to any error bit count falling within the interval [0, (X−1)] is 0%.

According to some variations of this embodiment, the controller can select one of a plurality of predetermined values as the value X. For example, the plurality of predetermined values is embedded in the error generator 1191, and the error generator 1191 itself can select one of the predetermined values as the value X. In another example, the plurality of predetermined values is embedded in the error generator 1191 for being selected by the microprocessor 112. In another example, the plurality of predetermined values is provided by the program code 112C, and the microprocessor 112 itself can select one of the predetermined values as the value X and then control the error generator 1191 to actively generate errors accordingly, causing the additional X error bits being generated. Thus, the present invention can promptly induce multiple-bit errors with ease, whereby the capability of the controller regarding handling multiple-bit errors can be easily verified.

Figure 4:
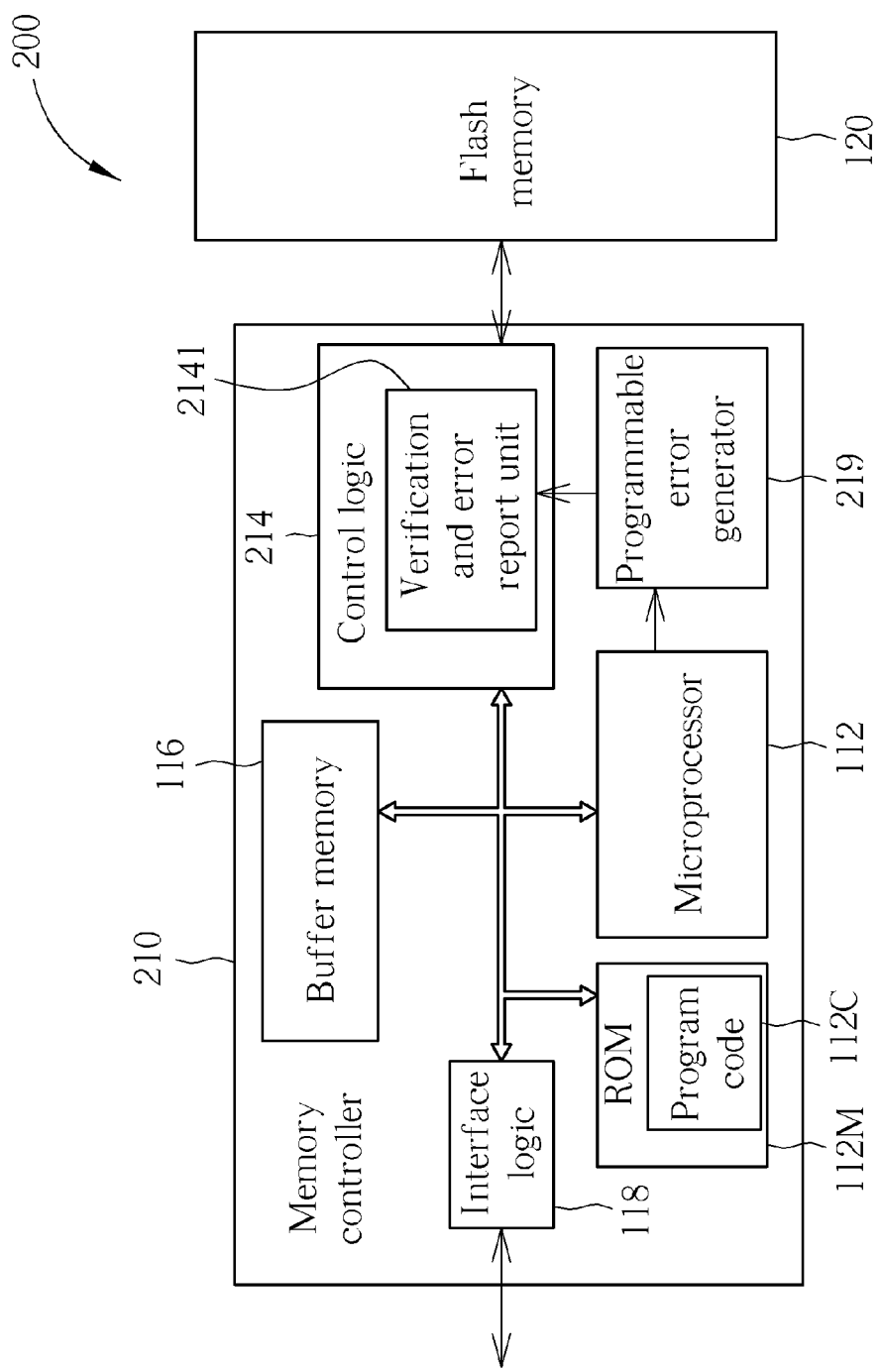
FIG. 4 is a diagram of a memory device according to a second embodiment of the present invention.

FIG. 4 is a diagram of a memory device 200 according to a second embodiment of the present invention, where this embodiment is a variation of the first embodiment. As shown in FIG. 4, the error generator 1191 mentioned above is replaced with a programmable error generator 219, and installing the timer 1190 and the changing unit 1192 is not required in this embodiment. Thus, the error generation module of this embodiment comprises the programmable error generator 219. In addition, the control logic 114 mentioned above is replaced with a control logic 214, which comprises a verification and error report unit 2141. In response to the change in architecture, the controller of this embodiment is referred to as the memory controller 210.

Please note that the memory device 200 is especially suitable for being applied to some variations disclosed above, such as the variations in which the controller can select one of the plurality of predetermined values as the value X. By utilizing the programmable characteristics of the programmable error generator 219, no matter regarding the architecture in which the plurality of predetermined values is embedded in the programmable error generator 219 for being selected by the programmable error generator 219 itself or for being selected by the microprocessor 112, or regarding the architecture in which the value X is merely selected/determined by the microprocessor 112 and is then sent to the programmable error generator 219, the present invention can be implemented without being hindered, having great flexibility.

In contrast to the related art, as the controller of the present invention (e.g. the memory controllers 110 or 210) can utilize the error generator installed therein (e.g. the error generators 1191 or 219) to actively generate errors of one or more specific types in order to increase the error rate(s) corresponding to the specific type(s), and can also utilize the error generator to forcibly make any component within the controller report errors, the present invention can enhance verification efficiency of the verification performed before the products leave the factory. Regarding the error handling mechanism such as the software error handling mechanism, the present invention can greatly enhance the verification efficiency. For example, the time required for performing verification according to the present invention is only a few hours (e.g. two or three hours), which is much less than the time required for performing verification according to the related art (e.g. up to several hundreds of hours). Therefore, the present invention can greatly save time and labor costs. In addition, as the controller of the present invention can utilize the error generator installed therein to actively generate errors of one or more specific types, the present invention can fulfill the completeness requirements of tests performed before the products leave the factory.

Those skilled in the art will readily observe that numerous modifications and alterations of the device and method may be made while retaining the teachings of the invention.

What is claimed is:

1. An operational method of a controller of a Flash memory, both the controller and the Flash memory being positioned within a memory device, the controller being utilized for accessing the Flash memory, the Flash memory comprising a plurality of blocks, the controller comprising a microprocessor arranged to control the access to the Flash memory and manage the plurality of blocks, the method comprising:
providing an error generation module; and
triggering the error generation module to forcibly make at least one component within the controller report at least one error of at least one specific type to the microprocessor.

2. The method of claim 1, wherein the at least one error of the at least one specific type comprises a plurality of errors of the at least one specific type; and the method further comprises:
verifying an error handling mechanism of the controller regarding the errors of the specific type.

3. The method of claim 1, further comprising:
utilizing a specific component positioned outside the error generation module to randomly trigger an operation being triggered by the triggering step; or
utilizing the specific component to trigger the operation being triggered by the triggering step according to a predetermined schedule.

4. The method of claim 1, wherein the error generation module comprises an error generator; and the method further comprises:
utilizing the error generator to randomly trigger an operation being triggered by the triggering step; or
utilizing the error generator to trigger the operation being triggered by the triggering step according to a predetermined schedule.

5. The method of claim 1, wherein the error generation module comprises a timer and an error generator; and the method further comprises:
utilizing the timer to perform timing control; and
utilizing the error generator to generate errors relating to time or to adjust time points of generating errors according to the timing control of the timer.

6. The method of claim 1, wherein the at least one error of the at least one specific type comprises a plurality of errors of the at least one specific type; the error generation module comprises an error generator and a changing unit; and the method further comprises:
utilizing the error generator to generate errors; and
utilizing the changing unit to change signals between the Flash memory and the controller according to the errors generated by the error generator in order to generate the errors of the specific type.

7. The method of claim 1, wherein the at least one error of the at least one specific type comprises a plurality of errors of the at least one specific type; the error generation module comprises an error generator; and the method further comprises:
utilizing the error generator to change at least one parameter of the at least one component to forcibly make the at least one component within the controller report the errors of the specific type.

8. The method of claim 1, wherein the at least one component comprises: a timing controller; a verification and error report unit; or an Error Correction Code (ECC) decoder.

9. The method of claim 1, wherein the error generation module comprises an error generator; and the error generator is a programmable error generator.

10. The method of claim 1, wherein the at least one error of the at least one specific type comprises a plurality of errors of the at least one specific type; and the errors of the at least one specific type comprise: Error Correction Code (ECC) errors, erasure errors, write/program errors, or data transfer errors.

11. A memory device, comprising:
a Flash memory comprising a plurality of blocks; and
a controller arranged to access the Flash memory and manage the plurality of blocks, and further to control operations of the controller, wherein the controller comprises:
a microprocessor arranged to control the access to the Flash memory and manage the plurality of blocks, and further control operations of the controller; and
an error generation module;
wherein the controller triggers the error generation module to forcibly make at least one component within the controller report at least one error of at least one specific type to the microprocessor.

12. The memory device of claim 11, wherein the at least one error of the at least one specific type comprises a plurality of errors of the at least one specific type; and the controller verifies an error handling mechanism of the controller regarding the errors of the specific type.

13. The memory device of claim 11, wherein the controller utilizes a specific component positioned outside the error generation module to randomly trigger an operation being triggered by the triggering step of the controller, or utilizes the specific component to trigger the operation being triggered by the triggering step according to a predetermined schedule.

14. The memory device of claim 11, wherein the error generation module comprises an error generator; and the controller utilizes the error generator to randomly trigger an operation being triggered by the triggering step of the controller, or utilizes the error generator to trigger the operation being triggered by the triggering step according to a predetermined schedule.

15. The memory device of claim 11, wherein the error generation module comprises a timer and an error generator; and the error generation module utilizes the timer to perform timing control, and utilizes the error generator to generate errors relating to time or to adjust time points of generating errors according to the timing control of the timer.

16. The memory device of claim 11, wherein the at least one error of the at least one specific type comprises a plurality of errors of the at least one specific type; the error generation module comprises an error generator and a changing unit; and the error generation module utilizes the error generator to generate errors, and utilizes the changing unit to change signals between the Flash memory and the controller according to the errors generated by the error generator in order to generate the errors of the specific type.

17. The memory device of claim 11, wherein the at least one error of the at least one specific type comprises a plurality of errors of the at least one specific type; the error generation module comprises an error generator; and the controller utilizes the error generator to change at least one parameter of the at least one component to forcibly make the at least one component within the controller report the errors of the specific type.

18. The memory device of claim 11, wherein the at least one component comprises: a timing controller; a verification and error report unit; or an Error Correction Code (ECC) decoder.

19. The memory device of claim 11, wherein the error generation module comprises an error generator; and the error generator is a programmable error generator.

20. The memory device of claim 11, wherein the at least one error of the at least one specific type comprises a plurality of errors of the at least one specific type; and the errors of the at least one specific type comprise: Error Correction Code (ECC) errors, erasure errors, write/program errors, or data transfer errors.

21. A controller of a memory device, the controller being utilized for accessing a Flash memory comprising a plurality of blocks, the controller comprising:
    a read only memory (ROM) arranged to store a program code;
    a microprocessor arranged to execute the program code to control the access to the Flash memory and manage the plurality of blocks, and further control operations of the controller; and
    an error generation module;
    wherein the controller that executes the program code by utilizing the microprocessor triggers the error generation module to forcibly make at least one component within the controller report at least one error of at least one specific type to the microprocessor.

22. The controller of claim 21, wherein the at least one error of the at least one specific type comprises a plurality of errors of the at least one specific type; and the controller that executes the program code by utilizing the microprocessor verifies an error handling mechanism of the controller regarding the errors of the specific type.

23. The controller of claim 21, wherein the controller that executes the program code by utilizing the microprocessor utilizes a specific component positioned outside the error generation module to randomly trigger an operation being triggered by the triggering step of the controller, or utilizes the specific component to trigger the operation being triggered by the triggering step according to a predetermined schedule.

24. The controller of claim 21, wherein the error generation module comprises an error generator; and the controller that executes the program code by utilizing the microprocessor utilizes the error generator to randomly trigger an operation being triggered by the triggering step of the controller, or utilizes the error generator to trigger the operation being triggered by the triggering step according to a predetermined schedule.

25. The controller of claim 21, wherein the error generation module comprises a timer and an error generator; and the error generation module utilizes the timer to perform timing control, and utilizes the error generator to generate errors relating to time or to adjust time points of generating errors according to the timing control of the timer.

26. The controller of claim 21, wherein the at least one error of the at least one specific type comprises a plurality of errors of the at least one specific type; the error generation module comprises an error generator and a changing unit; and the error generation module utilizes the error generator to generate errors, and utilizes the changing unit to change signals between the Flash memory and the controller according to the errors generated by the error generator in order to generate the errors of the specific type.

27. The controller of claim 21, wherein the at least one error of the at least one specific type comprises a plurality of errors of the at least one specific type; the error generation module comprises an error generator; and the controller that executes the program code by utilizing the microprocessor utilizes the error generator to change at least one parameter of the at least one component to forcibly make the at least one component within the controller report the errors of the specific type.

28. The controller of claim 21, wherein the at least one component comprises: a timing controller; a verification and error report unit; or an Error Correction Code (ECC) decoder.

29. The controller of claim 21, wherein the error generation module comprises an error generator; and the error generator is a programmable error generator.

30. The controller of claim 21, wherein the at least one error of the at least one specific type comprises a plurality of errors of the at least one specific type; and the errors of the at least one specific type comprise: Error Correction Code (ECC) errors, erasure errors, write/program errors, or data transfer errors.

* * * * *